United States Patent [19]

Schneider et al.

[11] 4,291,377
[45] Sep. 22, 1981

[54] APPARATUS FOR MEASURING ELECTRICAL POWER

[75] Inventors: Gernot Schneider, Baar; Benedikt Steinle, Zug, both of Switzerland

[73] Assignee: LGZ Landis & Gyr Zug AG., Zug, Switzerland

[21] Appl. No.: 90,734

[22] Filed: Nov. 2, 1979

[30] Foreign Application Priority Data

Nov. 13, 1978 [CH] Switzerland .................. 11634/78

[51] Int. Cl.³ ........................................... G01R 11/32
[52] U.S. Cl. ..................................... 364/483; 324/142
[58] Field of Search ............... 364/483, 543; 328/144, 328/142; 324/142

[56] References Cited

U.S. PATENT DOCUMENTS

| | | | |
|---|---|---|---|
| 3,510,772 | 5/1970 | Luthi | 364/483 X |
| 3,517,311 | 6/1970 | Wasielewski et al. | 364/483 X |
| 3,775,683 | 11/1973 | Barta et al. | 364/483 X |
| 3,778,608 | 12/1973 | Richman | 364/483 X |
| 4,050,025 | 9/1977 | Gerber | 364/483 X |
| 4,080,568 | 3/1978 | Funk | 364/483 X |

FOREIGN PATENT DOCUMENTS

2714632 10/1978 Fed. Rep. of Germany .
1361140 7/1974 United Kingdom .
1373581 11/1974 United Kingdom .

OTHER PUBLICATIONS

A Standard Digital Energy Meter for Measurements in Single-Phase Circuits and of Active and Reactive Energy in Symmetrical Three-Phase Circuits, Sacerdoti, et al, Alta Freuenza, vol. 35, No. 11, pp. 889–898.

*Primary Examiner*—Edward J. Wise
*Attorney, Agent, or Firm*—Ernest F. Marmorek

[57] ABSTRACT

An apparatus for measuring a.c. power which subtracts an average value of current and voltage from sampled instantaneous current and voltage values, respectively. The resultant current and voltage values are multiplied, so as to obtain a power measurement substantially free of any sampling errors and any d.c. levels.

11 Claims, 4 Drawing Figures

Fig. 1
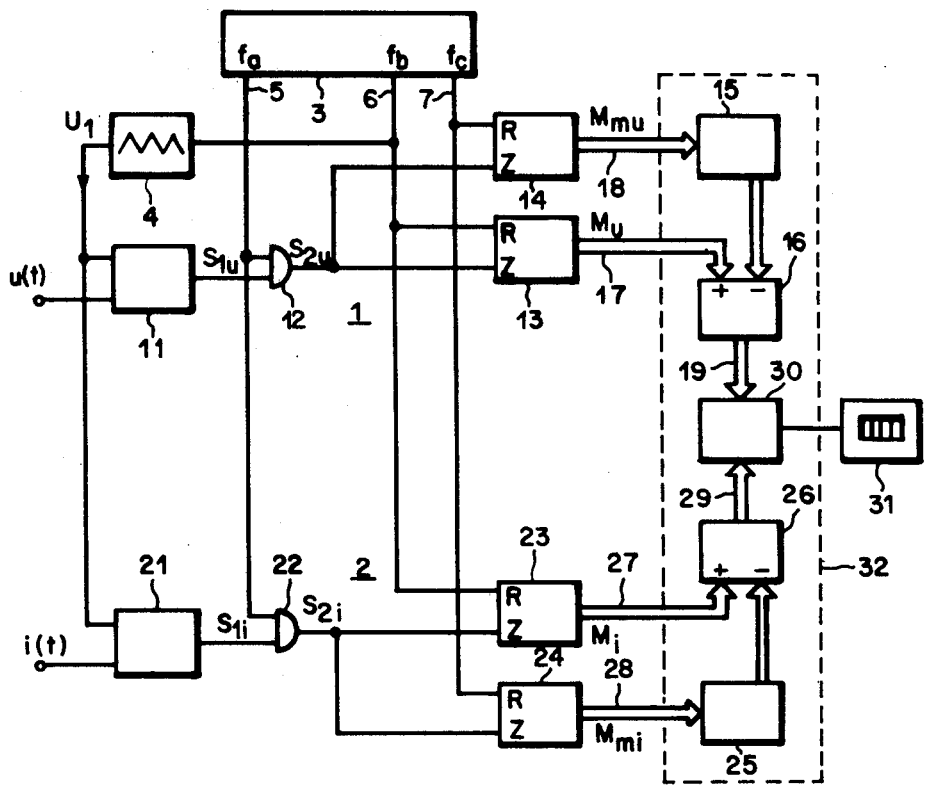
Fig. 2a
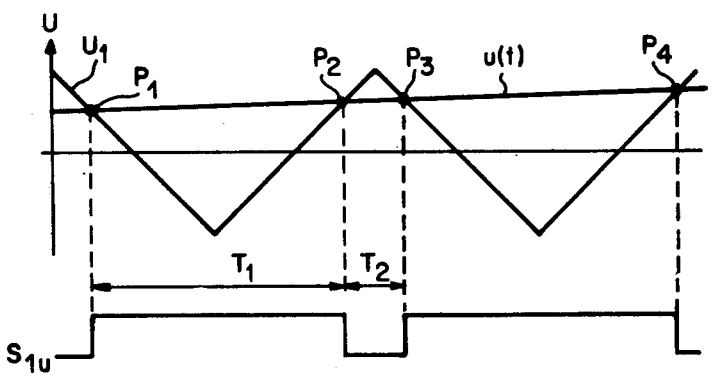
Fig. 2b
Fig. 2c

APPARATUS FOR MEASURING ELECTRICAL POWER

BACKGROUND OF THE INVENTION

It is known to periodically sample the alternating voltage and the alternating current delivered to a load to digitally measure the sampled points, to multiply the sampled points corresponding to the voltage and current, respectively, and to integrate the multiplied values so as to determine the power consumed by the load. Although the average value of an alternating waveform, be it a current or voltage waveform, is zero, the sum of periodically sampled values of an alternating current or voltage waveform is not necessarily zero, but only approaches zero; the deviation from the zero value of the sum of the samples of an alternating current or voltage waveform causes finite errors in the power measurement, when the aforesaid digital approach is used.

The deviation from zero is caused by such factors as asymmetry of the sampled points of the positive and negative portion of the waveform, respectively, current or voltage spikes, superimposed direct currents or voltages, and other causes.

An at least partial solution to the problem has been indicated in Swiss Pat. No. CH-PS 538,122 corresponding to British Pat. No. GB-PS 1,361,140, in which a product between current and voltage is formed according to a statistical coincidence method. In the Journal "Alta Frequenza" Vol. 35, Number 11, pages 889 to 898, Sacerdoti et al. disclose a digital energy meter, based on the sum of the partial product of instantaneous voltage and current values.

From German Pat. No. DE-27 14 632, there has become known a method for determining electrical power consumed by a load, wherein a stochastic coder employs two null potential scanning phases within an interrogation cycle, so as to form the product of null potentials, an impulse sequence proportional to this product being counted by forward/backward counter, when counting in the backward mode.

Richman, in U.S. Pat. No. 3,778,608 discloses electrical measuring systems using a multiplier operating according to the formula $(a+b)^2-(a-b)^2+4ab$.

Hunter, in British Pat. No. 1,373,581 discloses a wattmeter using an analog to digital converter, and a digital multiplier.

None of the aforesaid references accomplish the task of compensating for any deviation of the average from zero of digitized values of a voltage or current waveform in a simple manner.

SUMMARY OF THE INVENTION

It is therefore one of the principal objects of the present invention to devise a simple apparatus and method for measuring electrical power consumed by a load, in which the product of voltage and current is measured digitally, and which compensates for any deviation from zero of the average values of the digital samples of a voltage-or current-waveform.

BRIEF DESCRIPTION OF THE DRAWING

The invention will be better understood with reference to the accompanying drawing in which:

FIG. 1 is a schematic diagram of the circuit of the present invention; and

FIGS. 2a, 2b and 2c show typical waveforms appearing in the circuit of the present invention.

DESCRIPTION OF THE PREFERRED EMBODIMENTS

Referring now to the drawing, specifically to FIG. 1, there will be seen a voltage-measurement circuit 1, and a current-measurement circuit 2. Impulse generator means, such as, for example an impulse generator 3, drive sampling means, such as, for example, a triangular waveform generator 4, which waveform generator 4 is in turn connected to voltage and current converter means, such as, for example, a voltage waveform comparator 11, and a current waveform comparator 21. The converter means includes an AND gate 12, postcoupled to the comparator 11, and an AND gate 22, postcoupled to the comparator 21. The impulse generator 3, which is preferably quartz-crystal controlled, provides a fundamental frequency $f_a$, at a frequency of, for example $2^{22}$ Hz, which frequency is fed to two respective inputs of the AND gates 12 and 22. By internal frequency division within the impulse generator 3, subharmonic frequencies $f_b$ of, for example $2^{10}$ Hz, and $f_c$ of, for example 2 Hz are generated. The frequency $f_b$ drives the triangular waveform generator 4, and is also applied to the reset inputs of two counters 13 and 23 postcoupled to the AND gates 12 and 22, respectively. The output of the impulse generator 3 at the frequency $f_c$ is fed through averaging means, such as for example, counters 14 and 24, respectively, which average the count of the pulses generated by the impulse generator 3 during specified portions of the voltage or current waveforms passing through the load, whose energy consumption is to be measured. The frequencies $f_a$, $f_b$, and $f_c$ are available on terminals 5, 6 and 7 of the impulse generator 3, respectively. The output of the counters 14 and 24 are fed to two smoothing filters 15 and 25, respectively, via data buses 18 and 28. Corresponding data buses 17 and 27 feed the outputs of the counters 13 and 23, respectively, to subtractor means, such as for example subtractors 16 and 26, whose other inputs are connected to the respective output of counters 14 and 24. The output of subtractors 16 and 26 are fed via data buses 19 and 29 to multiplier means 30, while the output of multiplier means 30 is fed to integrating means, such as an impulse counter 31, which measures the energy consumed by the load. The other inputs of comparators 11 and 21 receive the voltage waveform u(t), and the current waveform i(t), respectively. The output of the AND gates 12 and 22 is also connected, on one hand, to the counting inputs of the counters 13 and 14, and on the other hand to the counting inputs of the counters 23 and 24, respectively.

It is advantageous if the smoothing filters 15 and 25, the subtractors 16 and 26, and the multiplier means 30 form part of a microcomputer or microprocessor 32.

The operation of the device, according to the present invention, is as follows:

The triangular waveform generator 4 and the comparator 11 cooperate so as to yield an output shown as $S_{1u}$ at the output of the comparator 11, which will be seen to have a leading edge at the intersection $P_1$ of the triangular waveform $U_1$ with the voltage waveform u(t), and a trailing edge at an intersection point $P_2$ of the waveform u(t) with the triangular waveform $U_1$. Similarly, another leading edge of the waveform $S_{1u}$ occurs at an intersection of $P_3$, and another trailing edge occurs at point P4. The triangular waveform generator 4 and the comparator 21 cooperate in a similar manner.

Pulses generated by the impulse generator 3 only pass the AND gates 12 and 22 during the duration $T_1$ of the waveform $S_{1u}$. These pulses are shown as a waveform $S_{2u}$, no pulses being passed during the duration $T_2$ shown in waveform $S_{1u}$ in FIG. 2b. It will be seen that the triangular waveform $U_1$ is symetrical about the zero axis of the voltage- or current-waveform.

It will be seen that $$\frac{T_1 - T_2}{T_1 + T_2} = k.u. \tag{1}$$

the period $T_1$ being the duration of a sequence of impulses, and the period $T_2$ being the time duration of the interval between impulse sequences.

It should be noted that "k" is a constant, and that "u" denotes the instantaneous value of the signal u(t), provided that u(t) is constant during the time period $T_1+T_2$ (see FIG. 2). This provision is fulfilled in practice, if the frequency of the triangular waveform $U_1$ is considerably greater than the network frequency.

The time interval $T_1+T_2$ corresponds to the period $T_r$ of the triangular waveform $U_1$.

Equation (1) can therefore be rewritten as $$\frac{2T_1 - T_r}{T_r} = k.u. \tag{2}$$

From equation (2), it can therefore be seen that the time interval $T_1$ is a measure for the instantaneous value of the signal u(t), as $T_r$ and k are known. By digital counting of the time interval $T_1$, according to FIG. 2c, a digital value is therefore obtained for the instantaneous value u.

The number of pulses within one period of the rectangular waveform U, occurring at the frequency $f_b$ is a measure of the instantaneous value of the signal u(t). During each period of the frequency $f_b$, the impulse counter 13 counts the number of the pulses, and is then reset via a reset impulse on its reset input R. Just prior to resetting the counter 13, the contents of the counter 13 are transferred via the data bus 17 to the subtractor 16. The contents of the counter 13 at this time represent the digital measurement value $M_u$ for the instantaneous value of the signal u(t), and consequently for the voltage of the alternating current supplied to the load.

The impulse counter 14 determines the average value $M_{mu}$ of the impulse sequence $S_{1u}$ shown in FIG. 2b over $N \geq 1$ periods of the network frequency, where N is an integer. Impulses of the impulse sequence $S_{2u}$ shown in FIG. 2c are always being passed to the counter 14. Following N periods of the network frequency, the impulse counter 14 is reset by a reset impulse occurring at the frequency $f_c$ and restarted. During each summing period T $$T = \frac{1}{f_c} = N \cdot \frac{1}{f_N}$$

where $f_N$ is equal to the network frequency, and the impulse counter 14 sums the voltage values $M_u$, and thus forms the sum $$\sum_{i=1}^{n} M_u$$

where $$n = \frac{f_b}{f_c} = N \cdot \frac{f_b}{f_N}$$

The mean value $M_{mu}$ of the measurement values $M_u$ is $$M_{mu} = \frac{1}{n} \sum_{i=1}^{n} M_u$$

Prior to each reset of the impulse counter 14, the average value $M_{mu}$ is transferred via the data bus 18 and, if necessary, via the smoothing filter 15, to the subtractor 16. A required division of the contents of the impulse counter 14 to obtain the average value $M_{mu}$ by the number n may be obtained by appropriate reading out of the contents of the counter, which will be described in detail further below.

The explanation of the operation of the voltage circuit 1 also applies in a similar manner for the current circuit 2. At the end of each period of the frequency $f_b$, the contents of the impulse counter 23, which corresponds to the impulse sequence $S_{1i}$, and which represents a digital measurement value $M_i$ for the current, is transferred via the data bus 27 to the subtractor 26. Furthermore, at the end of each period the frequency $f_c$, the average value $M_{mi}$ of the measurement values $M_i$ is transferred to the subtractor 26 via the data bus 28.

The subtractor 16 forms, whenever a new measurement value $M_u$ arrives, the difference $M_u - M_{mu}$ from this measurement value, and the presently available average value $M_{mu}$. The subtractor 26 forms a corresponding $M_i - M_{mi}$ value. The so corrected measurement values are multiplied with one another in the multiplier 30. From the instaneous values occurring at the frequency $f_b$ the energy consumed by the load may be obtained in a known manner by the impulse counter 31, acting as an integrating means.

For a better understanding of the operation of the apparatus of the present invention, specific numerical values will be used in what follows.

For the purpose of an explanation of the operation of the circuit, using numerical values, assume that:
$f_N = 50$ Hz
$f_a = 2^{22}$ Hz
$f_b = 2^{10}$ Hz $= 1024$ Hz, and
$f_c = 2$ Hz
and therefore
n = 512 = $2^9$, and
N = 25.

In the aforesaid example the average values are therefore computed over 25 periods of the network frequency. Formation of the average value extends over 512 measuring periods $M_u$ or $M_i$. As the frequencies $f_a$ and $f_b$ are not necessarily a multiple of the network frequency $f_N$, the measurement error due to the finite sampling frequency is compensated over several measurement periods. The division of the contents of the impulse counters 14 and 24 by $n = 2^9$ can be obtained in a simple manner by a shift register operation over 9 bits, so that, when the counter is read out, the lowest 9 bits are ignored.

When $T_1 = T_2$, there are counted 2,048 impulses into the impulse counters 13 and 23, when $T_1 = 0$ zero impulses are counted into the impulse counters 13 and 23, and when $T_2 = 0$, 4,096 impulses are counted into the impulse counters 13 and 23. These impulse counters therefore represent the voltage or the current (provided that the comparators 11 and 21 are controlled up to their limit values, which should be avoided) by numerical values within the range of 0 to 4,096; this means that the 0 axis is displaced by the value 2,048. The average values $M_{mu}$ or $M_{mi}$ also fluctuate around the numerical value 2,048, so that the difference formed by the subtractor 16 or 26 assumes a value dependent on the magnitude and sign of the signals u(t), or i(t), between −2048 and +2048.

The advantages of the above measurement device are now easily ascertainable. The average value of the voltage or current of an alternating current waveform over one or several network periods is 0, as is well known. Any deviation of the average value from 0 counted by the impulse counters 14 and 24 (or deviation from the value 2048 in the example shown) is equal to the average measurement error, and may occur as the result of offset voltages, offset currents, asymmetries, and the like of the elements taking part in the measurements, or by direct currents or direct voltages ocurring within the alternating current network, so that at least theoretically the measurement error can be fully compensated. As the result of unavoidable fluctuations of the network frequency, and due to the finite sampling frequency, the average value cannot be obtained free of any error in practice, but nevertheless with sufficient accuracy. A further increase in measurement accuracy is due to the smoothing filters 15 and 25, which may be known as average value—or exponentional-type filters, operating according to a smoothing algorithm. The smoothing algorithm for determining average values may be stored in the memory of the microcomputer or microprocessor 32. In the event of a relatively low demand for measurement accuracy, it is sufficient to take the average value, and therefore also the difference value between a measurement value and the average value in only one of the channels 1 and 2, as an asymmetry error will in a first approximation only contribute to the product formed in the multiplier 30, if contained in both circuits 1 and 2 as can be readily seen be calculating the electric power P produced by an alternating voltage U·cos ω t causing an alternating current I·cos (ωt+φ) to flow, where U is the peak value of the voltage, ω stands for 2·π·f with f the network frequency, and I is the peak value of the current, which may be shifted against the voltage by a phase angle φ.

The electric power is then obtained as $$P = \frac{1}{T} \int_0^T (U \cdot \cos \omega t + U_o)[I \cdot \cos (\omega t + \phi) + I_o] dt$$

when $U_o$ and $I_o$ are the asymmetry or offset errors of U and I respectively. For calculating ease we take the measuring time T equal to one period of the network frequency $$T = \frac{2\pi}{\omega} \text{ and get}$$

$$P = \frac{U \cdot I}{2} \cos \phi + U_o \cdot I_o.$$

The first term at the right side determines the AC—power as expected whereas the second term indicates a DC—power simulated by the two offset values $U_o$ and $I_o$. Setting one $U_o$ or $I_o$ to zero theoretically eliminates the error completely. Under less idealized circumstances this is not always true as mentioned already above.

We wish it to be understood that we do not desire to be limited to the exact details of construction shown and described, for obvious modifications will occur to a person skilled in the art.

Having thus described the invention, what we claim as new and desire to be secured by Letters Patent, is as follows:

1. An apparatus for measuring power delivered at an alternating voltage by an alternating current to a load comprising in combination:
   sampling means for periodically sampling the alternating voltage and the alternating current delivered to the load at selected sampling points,
   converter means, including impulse generator means, for converting the sampled points to first and second sequences of a plurality of pulses, the number of pulses in each sequence being substantially proportional to the instaneous values of the alternating voltage and of the alternating current, respectively,
   first counting means for counting the first sequence of pulses,
   second counting means for counting the second sequence of pulses,
   averaging means for determining the average value of said first and second sequence of pulses, respectively, over at least one period of the alternating current,
   subtractor measns for obtaining difference values between said average value, and said first and second sequences of pulses, respectively,
   multiplier means for multiplying said respective difference values, to obtain successive product values,
   integrating means for integrating said successive product values over said at least one period so as to measure the power delivered to said load, whereby any error in determining said average value is eliminated from the power measurement.

2. An apparatus as claimed in claim 1 wherein said averaging means is a counter controlled by said converter means.

3. An apparatus as claimed in claim 1 further comprising a smoothing filter connected between said averaging means and said subtractor means.

4. An apparatus as claimed in claim 3, wherein said smoothing filter, said subtractor means, and said multiplier means form portions of a microprocessor, said microprocessor including memory means having stored therein an algorism for smoothing the average values determined by said averaging means.

5. An apparatus as claimed in claim 1, wherein said sampling means includes a function generator, and said converting means includes first and second comparators connected to the output of said function generator, and first and second AND gates having respective first inputs connected to the outputs of said first and second comparators, respectively, and wherein said first and second counting means are first and second counters, each counter having a counting input and a reset input, and wherein said averaging means has a counting input and a reset input, the outputs of said AND gates being connected to the counting inputs of said first and second counters, respectively, and to the set input of said averaging means, and wherein said impulse generator means has a first output connected to respective second inputs of said first and second AND gates, a second output connected to the reset inputs of said counters, and a third output connected to the reset input of said averaging means.

6. An apparatus as claimed in claim 5, wherein said averaging means includes third and fourth counters, each having a counting input and a reset input.

7. An apparatus as claimed in claim 5 wherein said impulse generator means has a fundamental frequency, available at its first output, a second frequency being a subharmonic of said first frequency available at its second output, and a third frequency being a subharmonic of said second frequency at its third output.

8. An apparatus as claimed in claim 7, wherein said sampling means operates at a sampling frequency controlled by said second frequency.

9. An apparatus as claimed in claim 1, wherein said impulse generator means is crystal-controlled.

10. An apparatus for measuring power delivered at an alternating voltage by an alternating current to a load comprising in combination:
 sampling means for periodically sampling the alternating voltage and the alternating current delivered to the load at selected sampling points,
 converter means, including impulse generator means, for converting the sampled points to first and second sequences of a plurality of pulses, the number of pulses in each sequence being substantially proportional to the instaneous values of the alternating voltage and of the alternating current, respectively,
 first counting means for counting the first sequence of pulses,
 second coupling means for counting the second sequence of pulses,
 averaging means for determining the average value of at least one of said first and second sequence of pulses, over at least one period of the alternating current,
 subtractor means for obtaining a difference value between said average value and said at least one of said first and second sequence of pulses,
 multiplier means for multiplying said difference value with the other of said first and second sequences of pulses to obtain a product value, and
 integrating means for integrating said successive product values over said at least one period so as to measure the power delivered to said load, whereby any error in determining said average value is eliminated from the power measurement.

11. In a method of measuring power delivered at an alternating voltage by an alternating current to a load, the steps comprising:
 obtaining first and second sequences of a plurality of pulses, the number of pulses in each sequence being substantially proportional to the instantaneous values of the alternating voltage, and of the alternating current, respectively,
 determining the average values of said first and second sequences of pulses, respectively, over at least one period of the alternating current,
 subtracting said average values from said first and second sequences of pulses, respectively, to obtain first and second difference values,
 multiplying said difference values to obtain a product value, and
 integrating successive product values over said at least one period, so as to measure the power delivered to said load, whereby any error in determining the average value is substantially eliminated from the power measurement.

* * * * *